(12) United States Patent
Jodka et al.

(10) Patent No.: US 11,196,339 B1
(45) Date of Patent: Dec. 7, 2021

(54) CHARGE-PUMP FOR A GATE DRIVER OF A SWITCHED DC/DC CONVERTER

(71) Applicant: TEXAS INSTRUMENTS INCORPORATED, Dallas, TX (US)

(72) Inventors: Eduardas Jodka, Freising (DE); Julian Becker Ferreira, Freising (DE); Christian Harder, Freising (DE); Florian Schimkat, Aachen (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/123,195

(22) Filed: Dec. 16, 2020

(51) Int. Cl.
*H02M 1/08* (2006.01)
*H02M 3/07* (2006.01)
*H03K 17/687* (2006.01)

(52) U.S. Cl.
CPC ............... *H02M 3/07* (2013.01); *H02M 1/08* (2013.01); *H03K 17/6871* (2013.01)

(58) Field of Classification Search
CPC ....... H02M 1/08; H02M 3/07; H03K 17/6871
USPC ......................................... 327/108, 109, 110
See application file for complete search history.

(56) References Cited

U.S. PATENT DOCUMENTS

| | | | | |
|---|---|---|---|---|
| 6,172,493 B1* | 1/2001 | Grant | ................... | H02M 7/538 323/224 |
| 8,970,185 B1* | 3/2015 | Sutardja | .................. | H02M 1/08 323/266 |
| 2004/0080963 A1* | 4/2004 | Grant | .................. | H02M 3/1588 363/59 |
| 2014/0062449 A1* | 3/2014 | Qu | ............................ | G05F 3/02 323/311 |
| 2014/0217959 A1* | 8/2014 | Chen | ................... | H02M 3/1588 320/107 |
| 2018/0004238 A1* | 1/2018 | Shen | .............. | H03K 19/017509 |

* cited by examiner

*Primary Examiner* — William Hernandez
(74) *Attorney, Agent, or Firm* — Mark Allen Valetti; Charles A. Brill; Frank D. Cimino

(57) ABSTRACT

A switching converter having a voltage input, a voltage output and a transistor connected between the voltage input and the voltage output, the switching converter including a control circuit comprising: a gate driver having an input, a first voltage supply input, a second voltage supply input and an output operable to be connected to a control terminal of the transistor; a bootstrap capacitor connected between the first voltage supply input and the second voltage supply input; and a charge pump having an input operable to be connected to the voltage input and an output connected to the first voltage supply input.

18 Claims, 14 Drawing Sheets

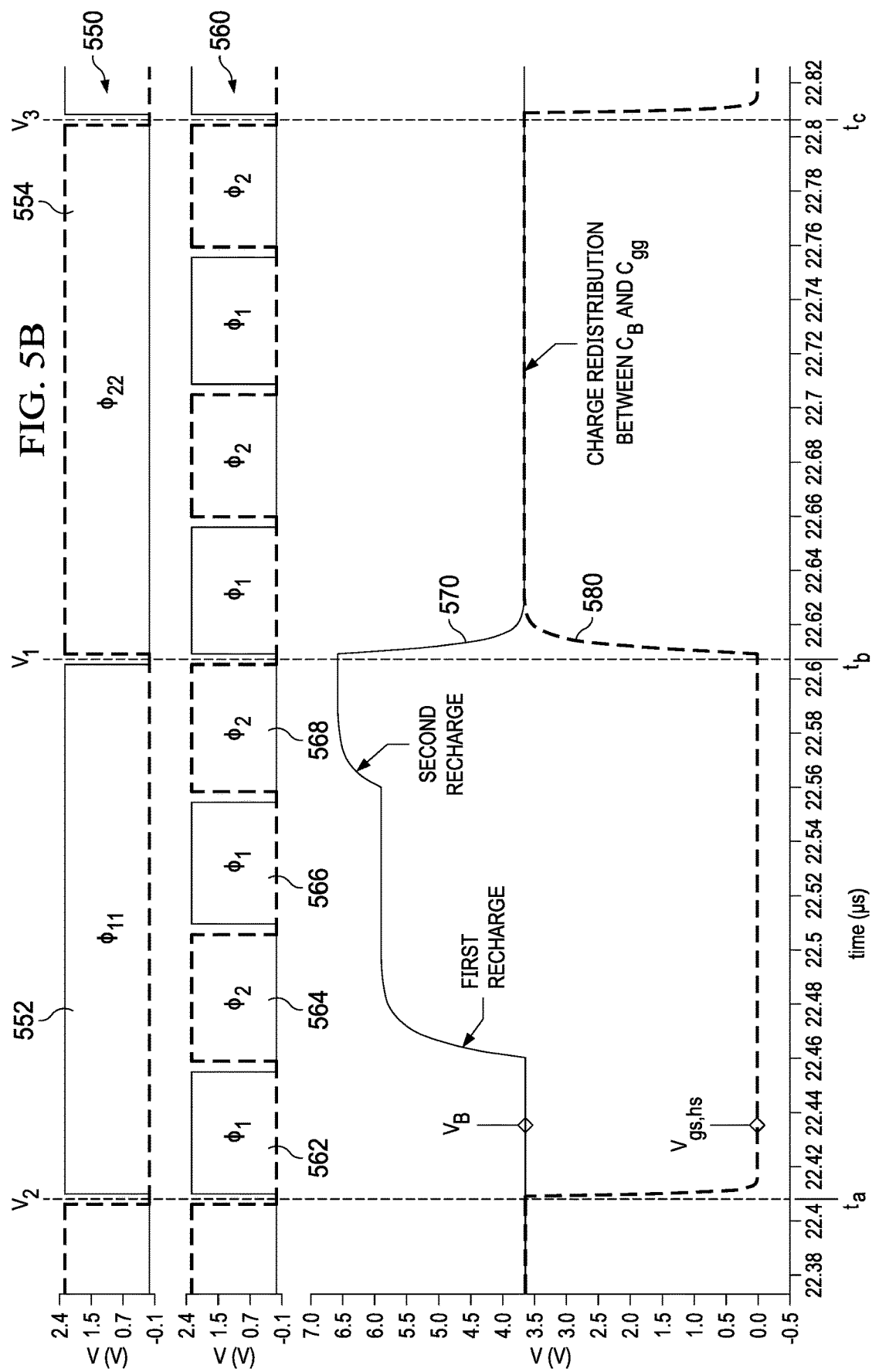

CHARGE-PUMP FOR A GATE DRIVER OF A SWITCHED DC/DC CONVERTER

BACKGROUND

Battery operated devices, such as personal electronic devices, robots, electric cars, industrial equipment, medical equipment and wearable devices, require a stable and consistent power source. In addition, longer battery life is desirable so high efficiency (especially during light loads) is important. Highly efficient voltage regulators may be used in these applications to provide a regulated voltage from the battery to the device while requiring less battery power to operate. In addition, display devices (such as organic light-emitting diode displays) also incorporate voltage regulators. A stable output voltage with minimal ripple is important for the proper operation of these display devices.

Switching regulators, also referred to as DC-DC converters, are used to convert or regulate an input voltage to an output voltage. The input voltage can be greater than, less than or equal to the output voltage. If the input voltage is greater than the output voltage, the converter/regulator may be referred to as a "step-down" converter/regulator or a "buck converter". FIG. 1A illustrates a basic buck converter. If the input voltage is less than the output voltage, the converter/regulator may be referred to as a "step-up" converter/regulator or a "boost converter". FIG. 1B illustrates a basic boost converter. If the converter/regulator can perform both step-up and step-down functions, then it may be referred to as a "buck-boost converter". FIG. 1C illustrates an inverting buck-boost converter.

Generally, switching regulators include at least one power switch and one or more energy storage devices, such as an inductor and a capacitor. The power switch can be implemented using a metal-oxide-silicon field-effect transistor (MOSFET), bipolar junction transistor (BJT) or other type of power transistor. The switching regulator may include a high-side switch and a low-side switch or a single power switch and a diode. FIGS. 1a, 1b and 1c illustrate converters using a single power switch and a diode. To implement the high-side/low-side configuration, the diode can be replaced with a transistor. Operation of the switching regulator basically includes turning on the power switch to supply energy to the inductor followed by turning off the power switch resulting in the transfer of the stored energy in the inductor to a load (and an output capacitor). The switching on/off of the power switch is controlled based on the load characteristics and the energy required by the load. In most switching regulators the power switch is turned on/off by a "gate driver" connected to the gate (for a MOSFET) of the power switch. Typically, the gate driver is an amplifier or buffer that has one supply rail connected to $V_{IN}$ and the other connected to ground or the switching node (shown as "SW" in FIGS. 1A, 1B and IC).

In some systems, especially systems that are powered by a battery, the supply voltages may be low. For example, $V_{IN}$ may be as low as 2 volts in some systems that utilize a buck converter. At such low supply voltages, it may be difficult to effectively turn on the power transistor, especially where one supply rail of the gate driver is connected to VIN and the other is connected to the switching node. To compensate for these low supply voltages, a bootstrap capacitor may be connected to across the supply rails for the gate driver so as to provide a higher voltage to the gate driver. Specifically, the bootstrap capacitor is charged while the gate driver is off and discharged when the gate driver is turned on.

SUMMARY

An example embodiment includes a switching converter having a voltage input, a voltage output and a transistor connected between the voltage input and the voltage output, the switching converter including a control circuit comprising: a gate driver having an input, a first voltage supply input, a second voltage supply input and an output operable to be connected to a control terminal of the transistor; a bootstrap capacitor connected between the first voltage supply input and the second voltage supply input; and a charge pump having an input operable to be connected to the voltage input and an output connected to the first voltage supply input. The transistor includes a first current terminal connected to the voltage input and a second current terminal coupled to the voltage output, the second current terminal is connected to a switching node of the switching converter. The second voltage supply input is connected to the switching node, and the bootstrap capacitor includes a first terminal connected to the first voltage supply input and a second terminal connected to the switching node. The charge pump includes a first switch connected between the charge pump input and the first capacitor, a second switch connected between the first capacitor and the second capacitor, a third switch connected between the second capacitor and the third capacitor and a fourth switched connected between the third capacitor and the output of the change pump. The charge pump includes a clock input, the clock input having a first clock phase and a second clock phase. During the first clock phase, the first switch and the third switch are closed and the second switch and the fourth switch are open; and during the second clock phase, the first switch and the third switch are open and the second switch and the fourth switch are closed. The switching converter may also include a controller having an output connected to the input of the gate driver.

Another example embodiment includes a control circuit operable to turn on and off a switching converter transistor connected between an input voltage and a switching node of a switching converter, the control circuit comprising: a gate driver having an input, a first voltage supply input, a second voltage supply input and an output operable to be connected to a control terminal of the switching converter transistor; a bootstrap capacitor connected between the first voltage supply input and the second voltage supply input; and a charge pump having an input operable to be connected to the input voltage and an output connected to the first voltage supply input. The second voltage supply input is connected to the switching node, and the bootstrap capacitor includes a first terminal connected to the first voltage supply input and a second terminal connected to the switching node. The charge pump includes a first switch connected between the charge pump input and the first capacitor, a second switch connected between the first capacitor and the second capacitor, a third switch connected between the second capacitor and the third capacitor and a fourth switched connected between the third capacitor and the output of the change pump. The charge pump includes a clock input, the clock input having a first clock phase and a second clock phase. During the first clock phase, the first switch and the third switch are closed and the second switch and the fourth switch are open, and, during the second clock phase, the first switch and the third switch are open and the second switch and the fourth switch are closed.

Another Example embodiment includes a switching converter comprising: an input connected to an input voltage; an output connected to an output voltage; a switching node coupled to the output of the switching converter; a high-side transistor having a control terminal, a first current terminal connected to the input of the switching converter and a second current terminal connected to the switching node; a gate driver having a first voltage supply input, a second voltage supply input connected to the switching node and an output connected to the control terminal of the high-side transistor; a bootstrap capacitor connected between the first voltage supply input and the second voltage supply input; a charge pump having an input connected to the input voltage and an output connected to the first voltage supply input; and wherein the charge pump stores a charge during a period when the high-side transistor is off and supplies a voltage greater than the input voltage at the output of the charge pump when the high-side transistor is turned on.

BRIEF DESCRIPTION OF THE DRAWINGS

For a detailed description of various examples, reference will be made to the accompanying drawings in which:

FIGS. 5A and 5B are graphs of voltage versus time in accordance with various example embodiments;

The same or similar features in the figures will be referenced with the same reference numeral.

DETAILED DESCRIPTION

Figure 1A:
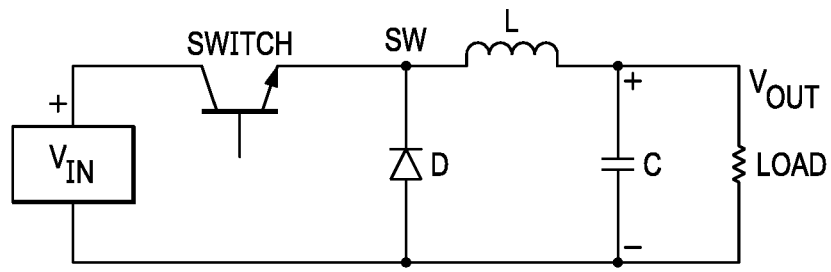
FIG. 1A is a schematic diagram of a traditional buck converter.
Figure 1B:
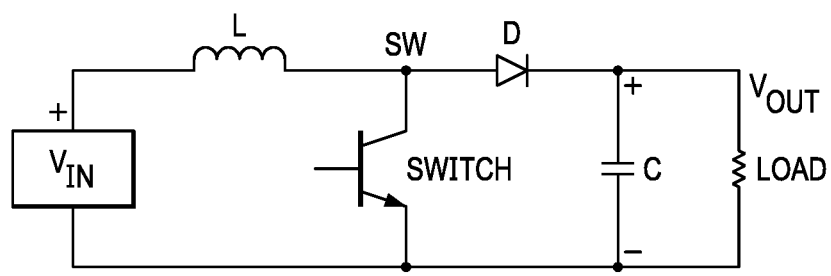
FIG. 1B is a schematic diagram of a traditional boost converter.
Figure 1C:
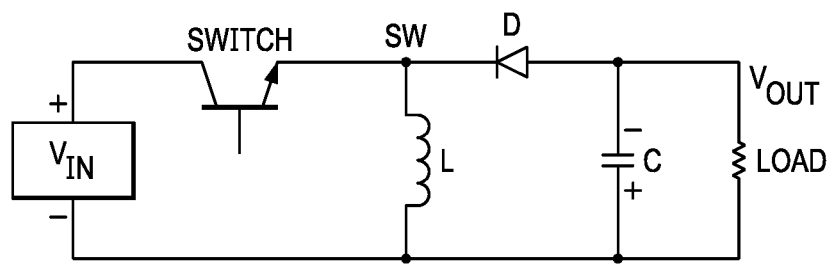
FIG. 1C is a schematic diagram of a traditional inverting buck-boost converter.
Figure 2:
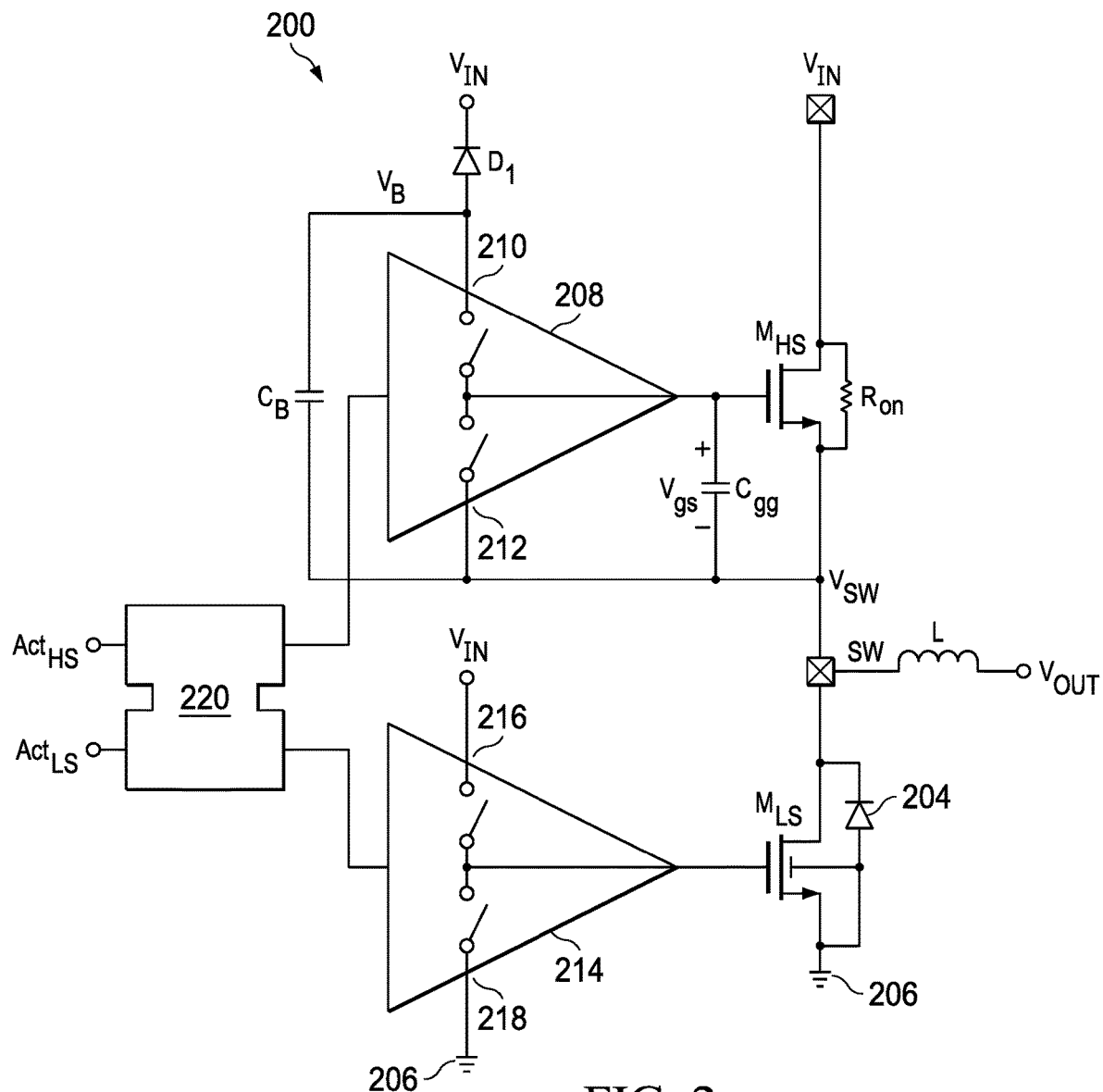
FIG. 2 is a schematic diagram of a buck converter in accordance with various example embodiments.

FIG. 2 illustrates a buck converter 200 of one example embodiment. This example embodiment utilizes a high-side transistor ($M_{HS}$) and a low-side transistor ($M_{LS}$). FIG. 2 illustrates the internal capacitance between the gate and source of the high-side transistor $M_{HS}$ as capacitor $C_{gg}$, the inherent "on resistance" (the resistance that a current encounters as it passes through the transistor) of the high-side transistor $M_{HS}$ as resistor $R_{on}$ and the gate to source voltage of high-side transistor $M_{HS}$ as $V_{gs}$. The internal diode for low-side transistor $M_{LS}$ is shown as diode 204. The drain of high-side transistor $M_{HS}$ is connected to the input voltage $V_{IN}$ and the source of high-side transistor $M_{HS}$ is connected to the switching node (SW), that is connected to the output voltage ($V_{OUT}$) through inductor L. The drain of low-side transistor $M_{LS}$ is connected to the switching node and the source is connected to common potential 206 (which may be connected to ground as is illustrated in FIG. 2). The gate of high-side transistor $M_{HS}$ is connected to the output of gate driver 208 and the gate of low-side transistor $M_{LS}$ is connected to the output of gate driver 214. One supply input 210 of gate driver 208 is connected to $V_{IN}$ through optional diode $D_1$ (which would prevent charge from the bootstrap capacitor $C_B$ dissipating through $V_{IN}$ instead of supplying charge to gate driver 208) and the other supply input 212 is connected to the switching node. One supply input 216 of gate driver 214 is connected to $V_{IN}$ and the other supply input 218 is connected to common potential 206. Bootstrap capacitor $C_B$ is connected between supply inputs 210 and 212. The voltage at the top plate of the bootstrap capacitor $C_B$ is $V_B$ and the voltage at the bottom plate is the voltage at the switching node, $V_{SW}$.

The inputs of gate drivers 208 and 214 are connected to the outputs of controller 220. Controller 220 may include a processor, state machine or other logic to effectively control when the high-side and low-side transistors turn on and off. Controller 220 may implement pulse-width modulation (PWM), pulse-frequency modulation (PFM), pulse-skipping mode (PSM) or any other type of continuous conduction mode (CCM) or discontinuous conduction mode (DCM) for turning on/off the high-side and low-side transistors. Controller 220 may be implemented using low-voltage logic components. While controller 220 is shown as a single controller, controller 220 may be two separate controllers. Alternatively, controller 220 may be incorporated in each gate driver 208 and 214. Controller 220 may include one or more inputs (such as ActHS and ActLS) which may be connected to another controller, $V_{IN}$, $V_{OUT}$ (possibly through a resistive divider) or some other type of feedback loop.

Without the bootstrap capacitor CB, the voltage at the output of gate driver 208 would be limited by the supply voltages ($V_{IN}$ and $V_{SW}$) applied to gate driver 208. With the addition of the bootstrap capacitor CB, the gate-to-source voltage, $V_{gs}$, for the high-side transistor $M_{HS}$ is increased to:

$$V_{gs} = \frac{V_{IN} * C_B}{C_{gg} + C_B} \quad (1)$$

As can be seen by equation (1), $V_{gs}$ will be less than $V_{IN}$ but can approach it as the capacitance of $C_B$ is increased. However, if $V_{IN}$ is low (such as 2 V or less), the gate voltage at the high-side transistor may not be sufficient to ensure that the on-resistance of the high-side transistor is sufficiently low. In addition, as the capacitance of $C_B$ is increased the physical size of $C_B$ will increase. This may not be easily implemented, especially where converter 200 (or the gate drivers with or without controller 220) are implemented on a semiconductor die or in a semiconductor package.

Figure 3:
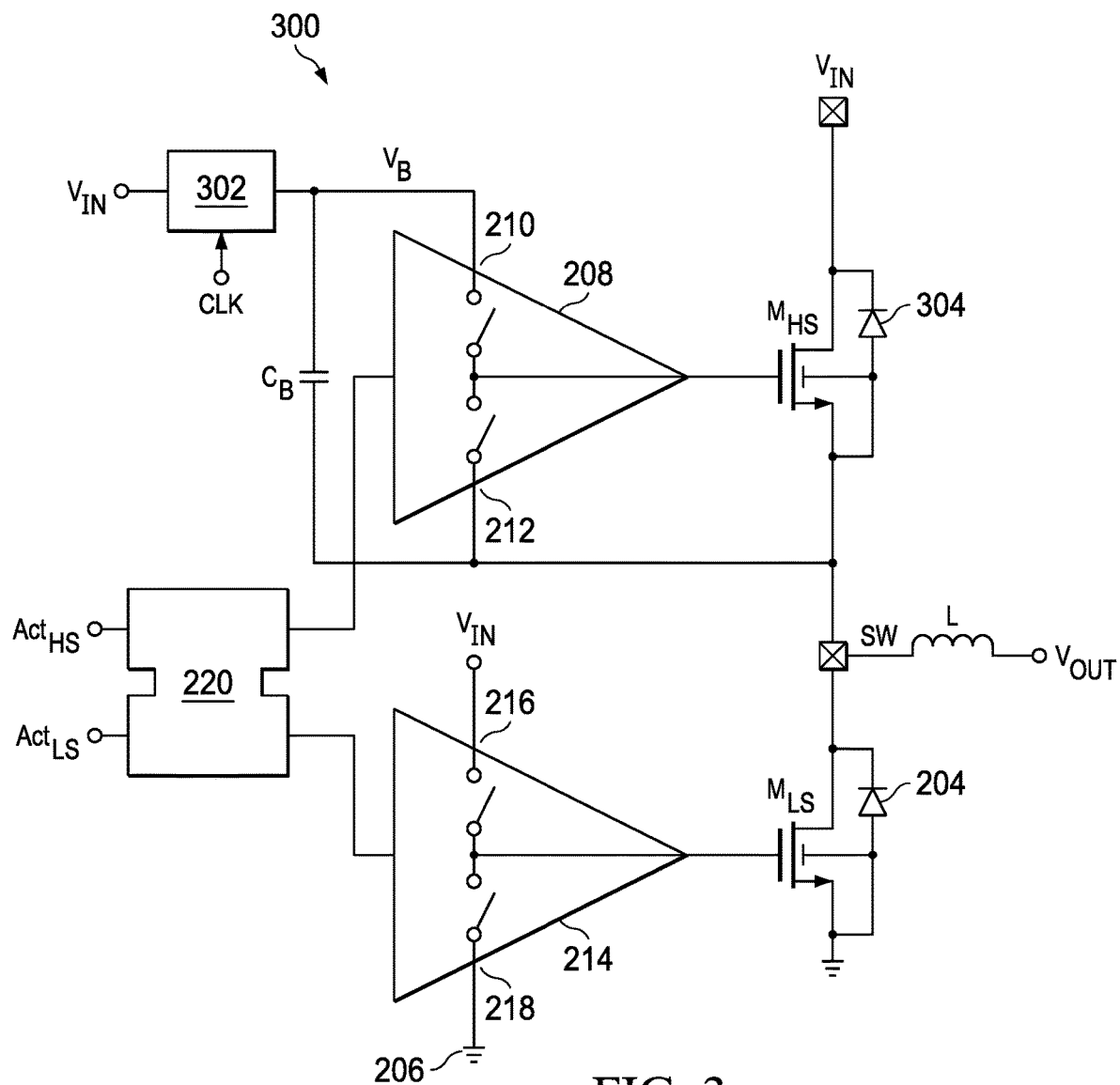
FIG. 3 is a schematic diagram of a buck converter in accordance with various example embodiments.

FIG. 3 illustrates a buck converter 300 of another example embodiment. Buck converter 300 includes charge pump 302 connected between $V_{IN}$ and supply input 210. Since charge pump 302 provides isolation between the top plate of bootstrap capacitor $C_B$ and $V_{IN}$, diode $D_1$ is not required (but may still be used) in this example embodiment. Charge pump 302 allows for an increased boosting of $V_B$ as will be discussed in more detail below.

A clock, CLK, is provided to charge pump 302. The clock may or may not have the same frequency and/or duty cycle as is used for the turning on/off of the high-side and low-side transistors. The on/off switching of these transistors may be accomplished independent of the clocking of charge pump 302. Clock CLK may be provided by a system clock or any other periodic pulse stream. The clock may have a 50% duty cycle, but it may not, and clock CLK may be provided by the same source (with the same signal) as is used by converter 300. In alternative example embodiments, gate drivers 208 and 214 may be implemented using buffers (such as unity gain amplifiers) or with another type of amplifier. Gate drivers 208 and 214 are depicted as having two internal switches (one to connect the output to one supply rail and the other to connect the output to the other supply rail). This illustrates that when turning on one of the transistors, one switch is closed while the other remains open. To turn off the transistor, the opposite will occur. Which switch is open/closed depends on the types of transistors used (e.g. nMOSFET or pMOSFET) and whether the transistor is to be turned on or off. In several example embodiments, either one or both of the high-side and low-side transistors are turned off. Both should not be turned on at the same time.

In one example embodiment, switching converter 300, except for inductor L, is implemented in a single semiconductor die. In alternative example embodiments, the high-side and low-side transistors are also implemented outside of the semiconductor die.

FIGS. 4A-4E are circuit models that illustrate the operation of charge pump 302 for several alternative embodiments. In the example embodiments shown in FIGS. 4A-4E, capacitors 403, 405 and 407 have the same capacitance value, $C_{CP}$. However, the bootstrap capacitance in some example embodiments has a capacitance value of that is multiple times larger than $C_{gg}$ (e.g. $C_B = 4 \ast C_{gg}$). In a first phase (charge pump 400 of FIG. 4A) of operation, $\Phi_1$, switch 402 is closed while switch 406 is open. In addition, the output of buffer 412 is connected to common potential 206 (based on the signal at node 411) thereby causing capacitor 403 (which has a capacitance value of $C_{CP}$) to charge to nearly the value of $V_{IN}$ (the voltage at node V1 will be VIN minus the voltage drop across switch 402). Because of this, the on-resistance of switch 402 (and switches 406, 408 and 410) should be as low as possible. If the voltage drop across switch 402 is negligible, the voltage at node $V_1$ at this phase (referred to as (i) is given by:

$$V_{1,\varphi1} = V_{IN} \qquad (2)$$

Figure 5A:
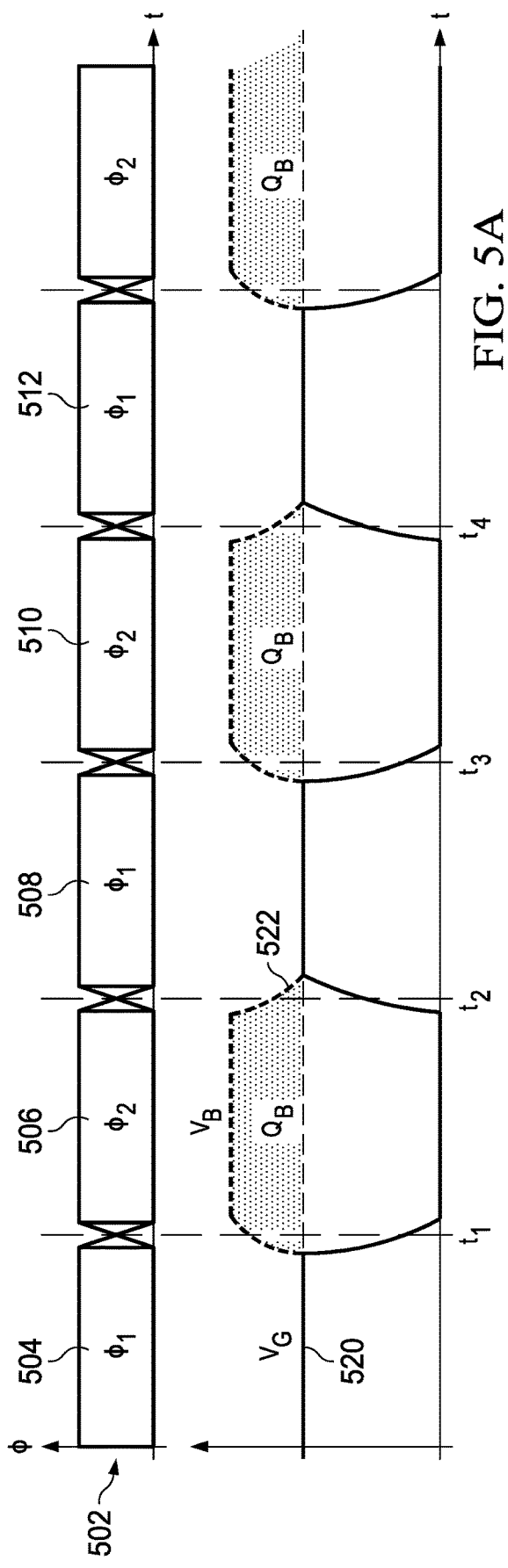

This period is illustrated as period 504 in FIG. 5A.

Figure 4A:
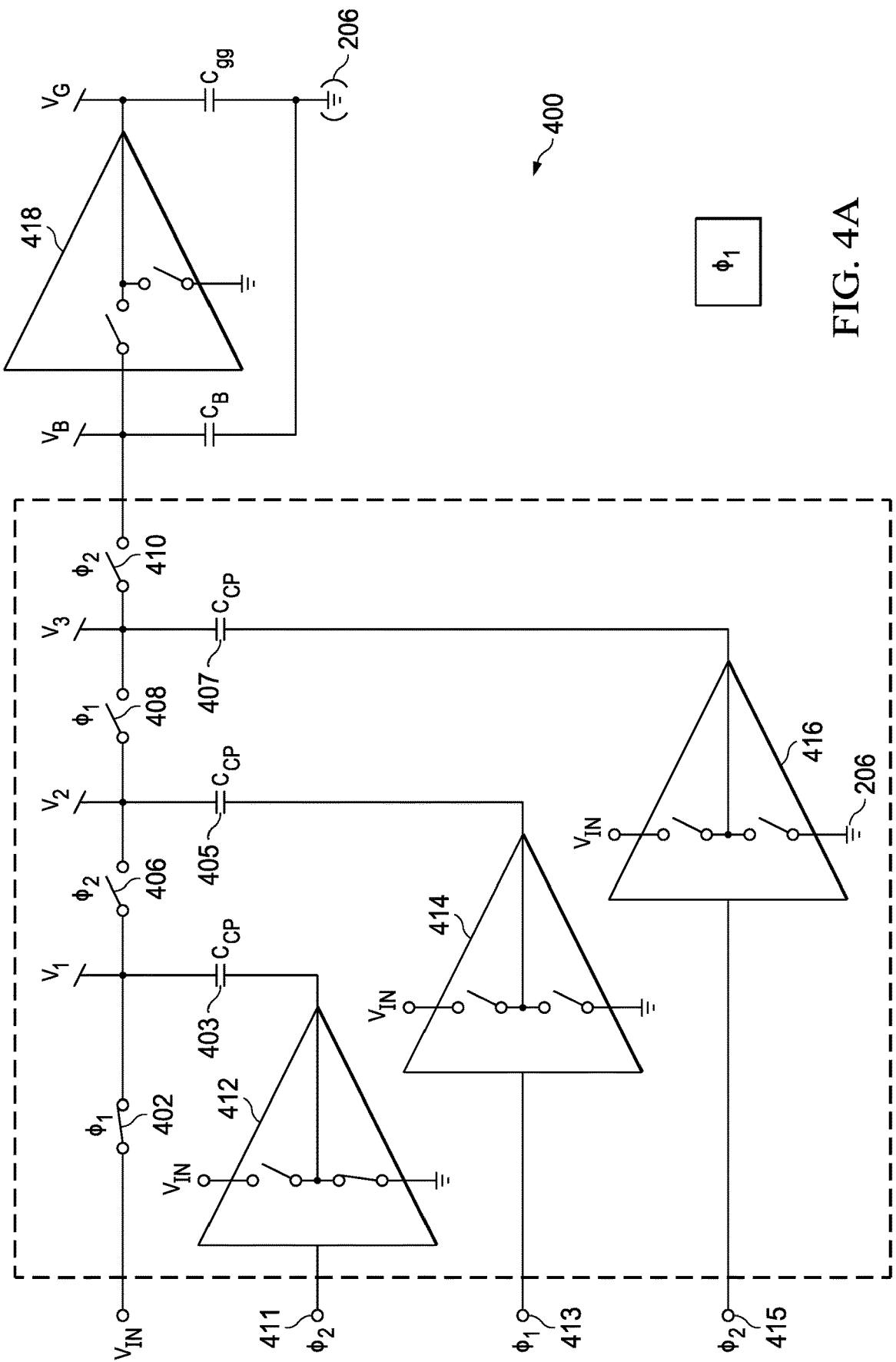
FIGS. 4A-4E are schematic diagrams illustrating the function of charge pump 302 of FIG. 3 in accordance with various example embodiments.
Figure 4B:
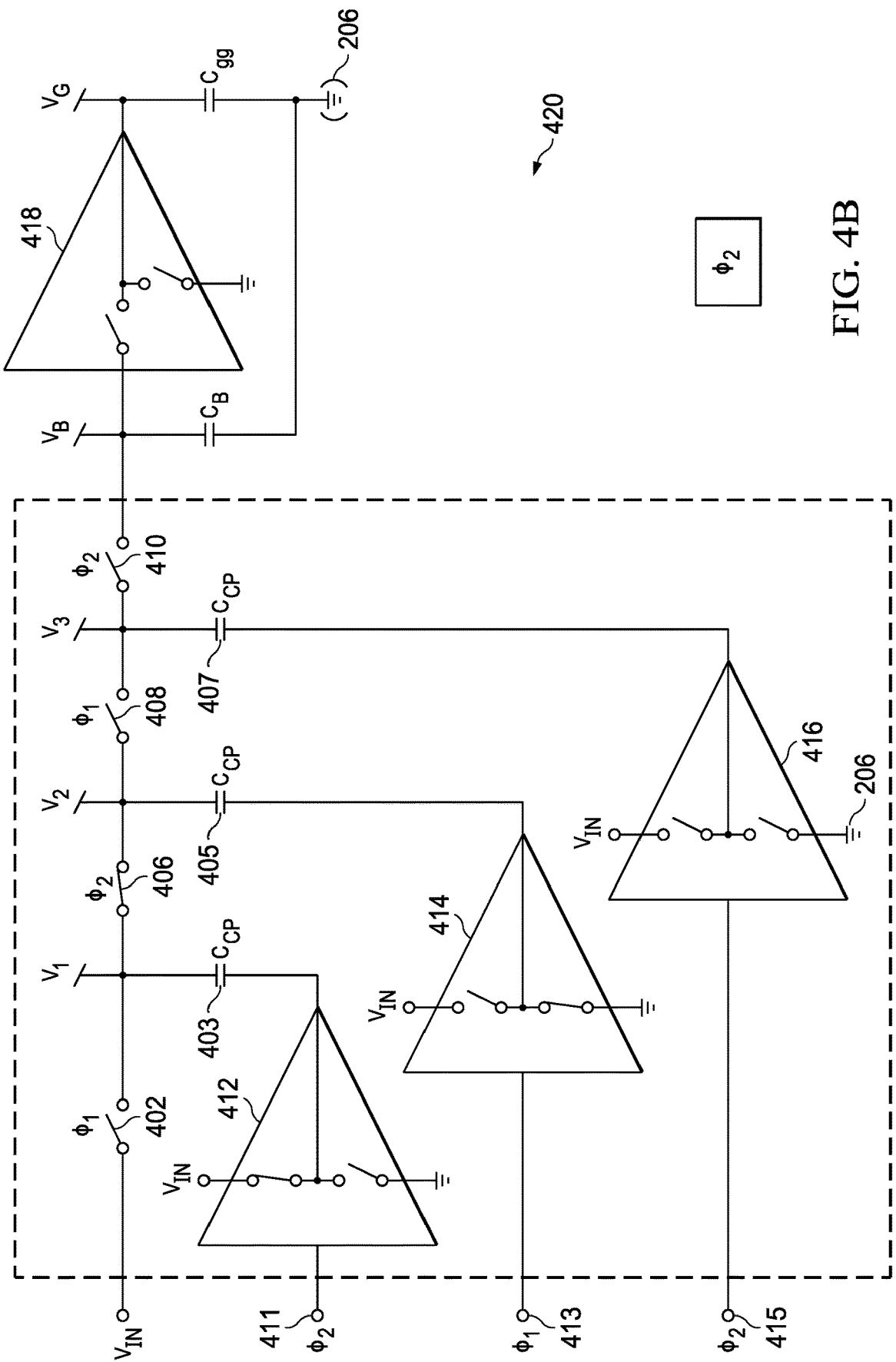

The next phase of operation is shown as charge pump 420 in FIG. 4B and as period 506 in FIG. 5A. During this phase, charge redistribution takes place between capacitors 403 and 405. Switches 402 and 408 are opened and switch 406 is closed. In response to the signals at nodes 411 and 413, the output of buffer 412 is connected to $V_{IN}$ and the output of buffer 414 is connected to common potential 206 (ground potential in some example embodiments). The voltage at node $V_2$ during this phase (referred to as $\Phi_2$) is given by:

$$V_{1,\varphi2} = V_{2,\varphi2} = \frac{V_{IN} + V_{2,\varphi1}}{2} \qquad (3)$$

where $V_{2,\Phi1}$ is the voltage of $V_2$ during the previous period (for example, the period shown in FIG. 4A and as shown as period 504 in FIG. 5A).

Figure 4C:
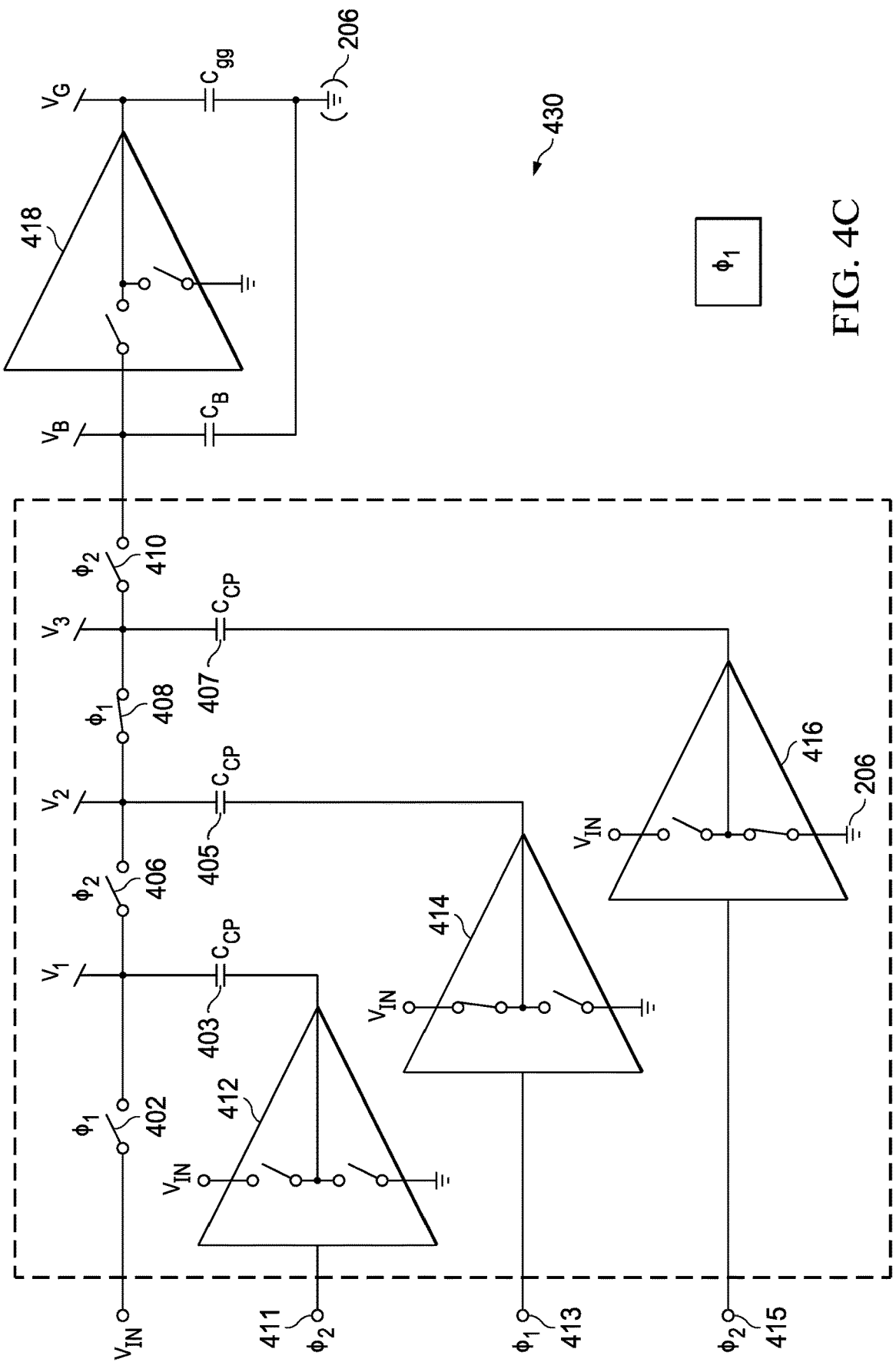

The next phase of operation is shown as charge pump 430 in FIG. 4C and as period 508 in FIG. 5A. During this phase, charge redistribution takes place between capacitors 405 and 407. Switches 406 and 410 are open and switch 408 is closed. In response to signals at nodes 413 and 415, the output of buffer 414 is connected to $V_{IN}$ and the output of buffer 416 is connected to common node 206 (ground potential in some example embodiments). The voltage at node $V_3$ during this phase (referred to as (i) is given by:

$$V_{2,\varphi1} = V_{3,\varphi1} = \frac{V_{IN}}{3} + \frac{2 \ast V_{3,\varphi2}}{3} \qquad (4)$$

where $V_{3,\Phi2}$ is the voltage of $V_3$ during the previous period (for example, the period shown in FIG. 4B and as shown as period 506 in FIG. 5A).

Figure 4D:
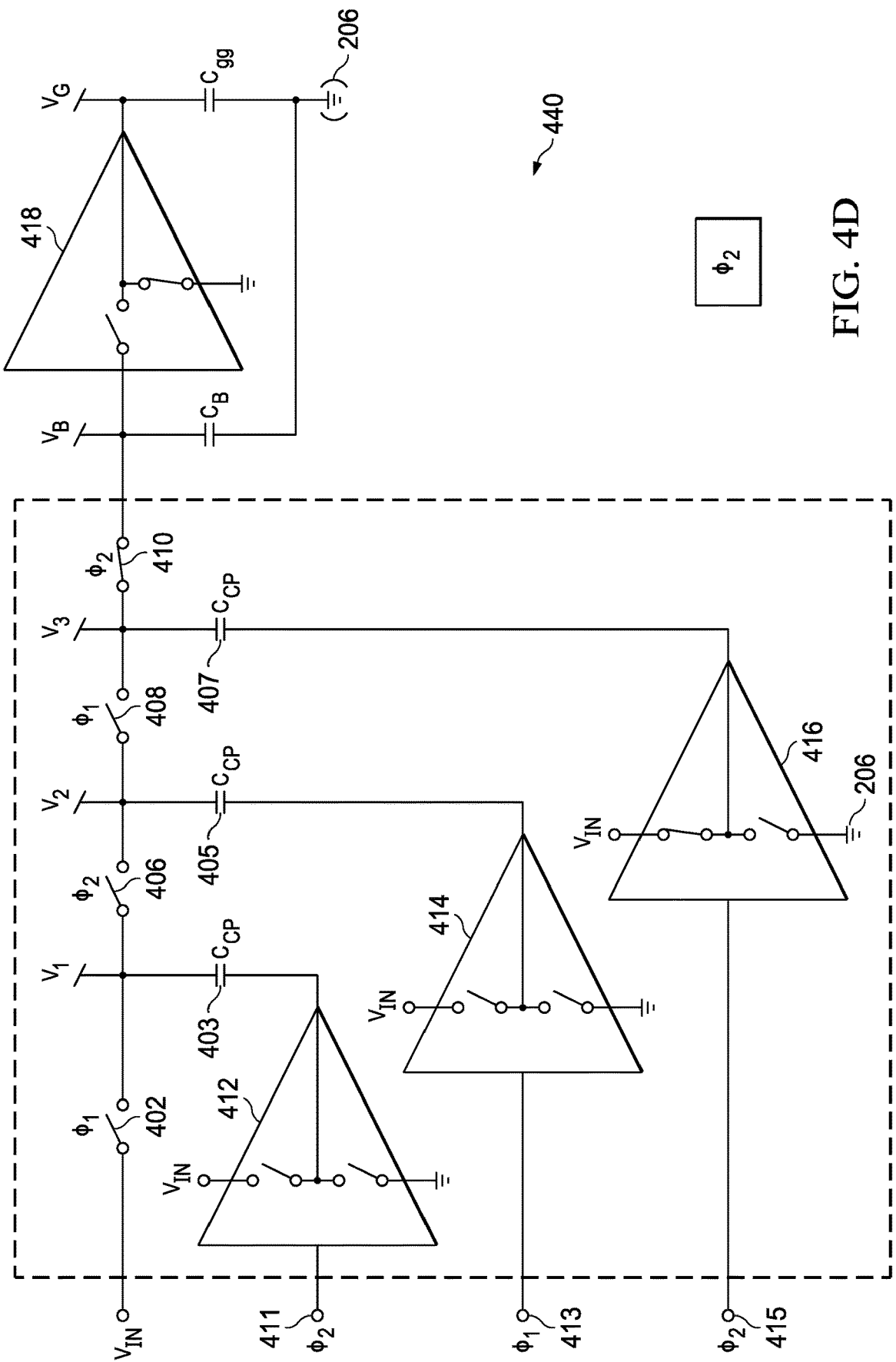

The next phase of operation is shown as charge pump 440 in FIG. 4D and as period 510 in FIG. 5A. During this phase, charge redistribution takes place between capacitor 407 and the bootstrap capacitor $C_B$. Since the bottom plate of the bootstrap capacitor $C_B$ is connected to common potential 206 (e.g. ground), the charge sharing takes place as provided in equation (5), below. During certain phases shown in FIG. 4A-4E, the low-side transistor $M_{LS}$ is turned on thereby connecting the source of the high-side transistor $M_{HS}$ to common potential 206. During the $\Phi1$ phase, the voltage across $C_{gg}$ is zero in some example embodiments. Switches 408 and 418, if buffer 418 is a switch are open and switch 410 is closed. In response to signals at node 415 and buffer 418, the output of buffer 416 is connected to $V_{IN}$ and the output of buffer 418 is connected to common node 206 (ground potential in some example embodiments). The voltage at node $V_B$ during this phase (referred to as $\Phi_2$) is given by:

$$V_{3,\varphi2} = V_{B,\varphi2} = V_{IN} + \frac{3 \ast V_{B,\varphi1}}{4} \qquad (5)$$

where $V_{B,\Phi1}$ is the voltage of $V_B$ during the previous period (for example, the period shown in FIG. 4C and as shown as period 508 in FIG. 5A).

Figure 4E:
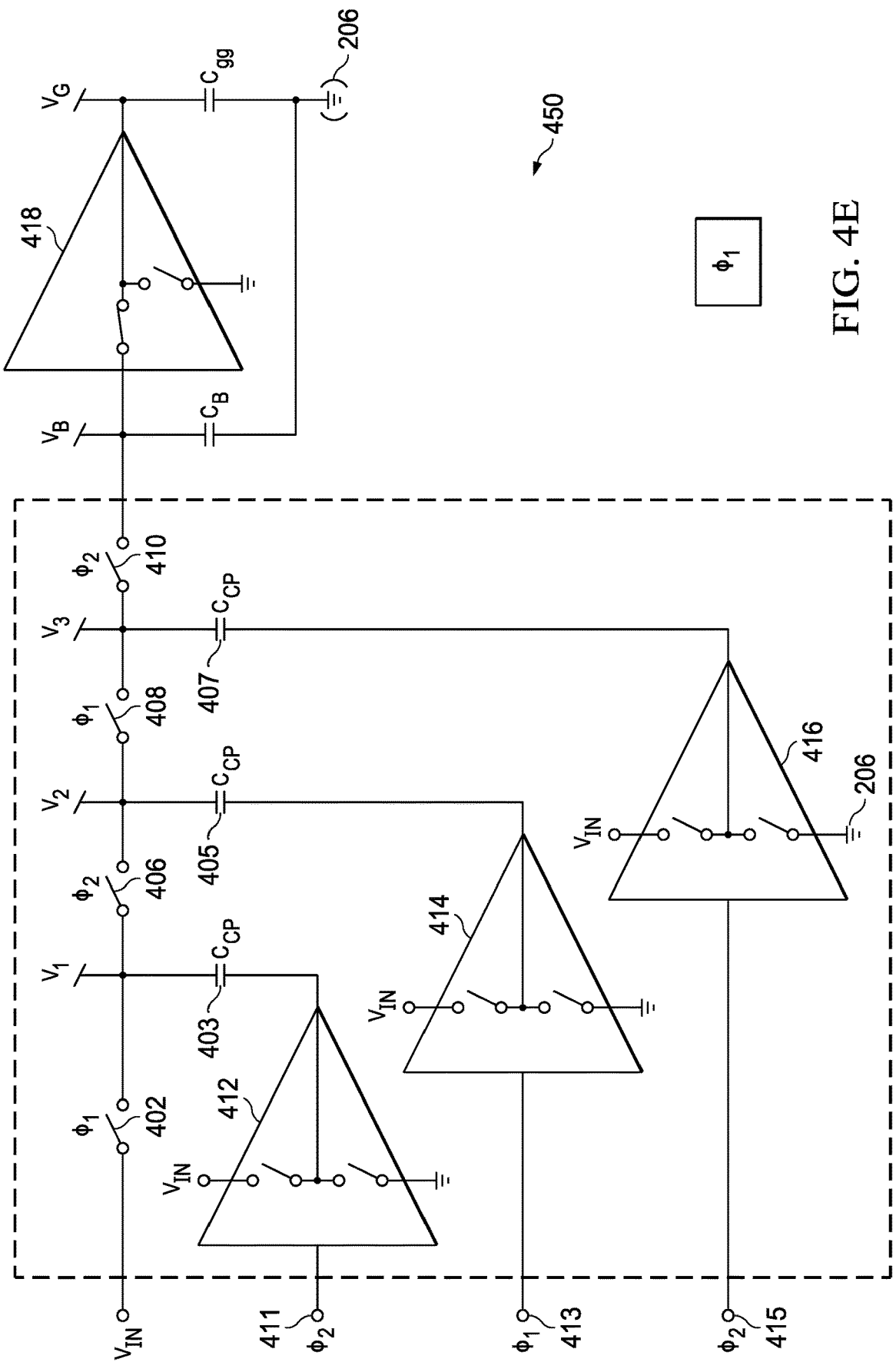

The next phase of operation is shown as charge pump 450 in FIG. 4E and as period 512 in FIG. 5A. During this phase, charge redistribution takes place between the bootstrap capacitor $C_B$ and the internal gate capacitor $C_{gg}$. Switch 410 is open and the input of buffer 418 is connected to its output (or, if it is a switch, the switch would be closed). The gate to source voltage of the high-side transistor $M_{HS}$ (shown as node $V_G$ in FIGS. 4A-4E) during this phase (referred to as $\Phi_1$) is given by:

$$V_{B,\varphi1} = V_{G,\varphi1} = 2 \ast V_{IN} \qquad (6)$$

With the addition of the charge pump of the example embodiments, the gate-to-source voltage of the high-side transistor $M_{HS}$ increases by at least twice as much.

In one example embodiment, all of the $\Phi_1$ operations (each operation shown in FIGS. 4A, 4C and 4E) occur during each phase shown as $\Phi_1$ in graphs 502 (FIG. 5A) and 560 (FIG. 5B), and all of the $\Phi_2$ operations (each operation shown in FIGS. 4B and 4D) occur during each phase shown as $\Phi_2$ in graphs 502 (FIG. 5A) and 560 (FIG. 5B). Under these conditions, the low-side transistor $M_{LS}$ should be turned on (with the high-side transistor $M_{HS}$ turned off) during the $\Phi_2$ phase. Since all of the $\Phi_1$ operations occur at each $\Phi_1$ time period and each $\Phi_2$ operations occurs at each $\Phi_2$ time period the voltages at $V_1$, $V_2$, $V_3$, $V_B$ and $V_{gs,hs}$ for each $\Phi_1$ period are:

| $V_1$ | $V_2$ | $V_3$ | $V_B$ | $V_{GS,HS}$ |
|---|---|---|---|---|
| $V_{IN}$ | $2 * V_{IN}$ | $2 * V_{IN}$ | $2 * V_{IN}$ | $2 * V_{IN}$ | and the voltages at $V_1$, $V_2$, $V_3$, $V_B$ and $V_{gs,hs}$ for each $\Phi_2$ period are:

| $V_1$ | $V_2$ | $V_3$ | $V_B$ | $V_{GS,HS}$ |
|---|---|---|---|---|
| $1.5 * V_{IN}$ | $1.5 * V_{IN}$ | $2.5 * V_{IN}$ | $2.5 * V_{IN}$ | 0 |

The values of $V_B$ and $V_{gs,hs}$ are shown in graphs 522 and 520 in FIG. 5A, respectively. Times t1, t2, t3 and t4 represent the times when the charge pump changes from one phase to the next.

As alluded to above, the low-side transistor should be on during, at least, the phases depicted in FIG. 4D (phase 510) and FIG. 4E (phase 512) in order to connect the bottom plate of the bootstrap capacitor $C_B$ to common potential 206 (ground potential for some embodiments). In light of this, the duty cycle of the switching converter can influence the gate-to-source voltage for the high-side transistor, because shorter on-periods for the low-side transistor translate into less charge storage in the charge pump and the bootstrap capacitor $C_B$. In the example embodiments where all $\Phi_1$ operations occur at each $\Phi_1$ time period and all $\Phi_2$ operations occur at each $\Phi_2$ time period, the low-side transistor $M_{LS}$ should be turned on (and the high-side transistor $M_{HS}$ should be turned off) during the $\Phi_2$ phase.

In alternative embodiments, buffers 412, 414 and 416 may be implemented using unity-gain amplifiers or two, two-pole switches controlled by control signals $\Phi_1$ and $\Phi_2$. In addition, capacitors 403, 405 and 407 may all have the same value of capacitance or they may have different capacitance values. The number of capacitors used in the charge pump may be increased or decreased depending on the application. The bootstrap capacitor $C_B$ may have a capacitance value that is a multiple of the internal transistor capacitance and the capacitance values for capacitors 403, 405 and 407 may be a multiple/fraction of the capacitance value of the bootstrap capacitor $C_B$.

Figure 10:
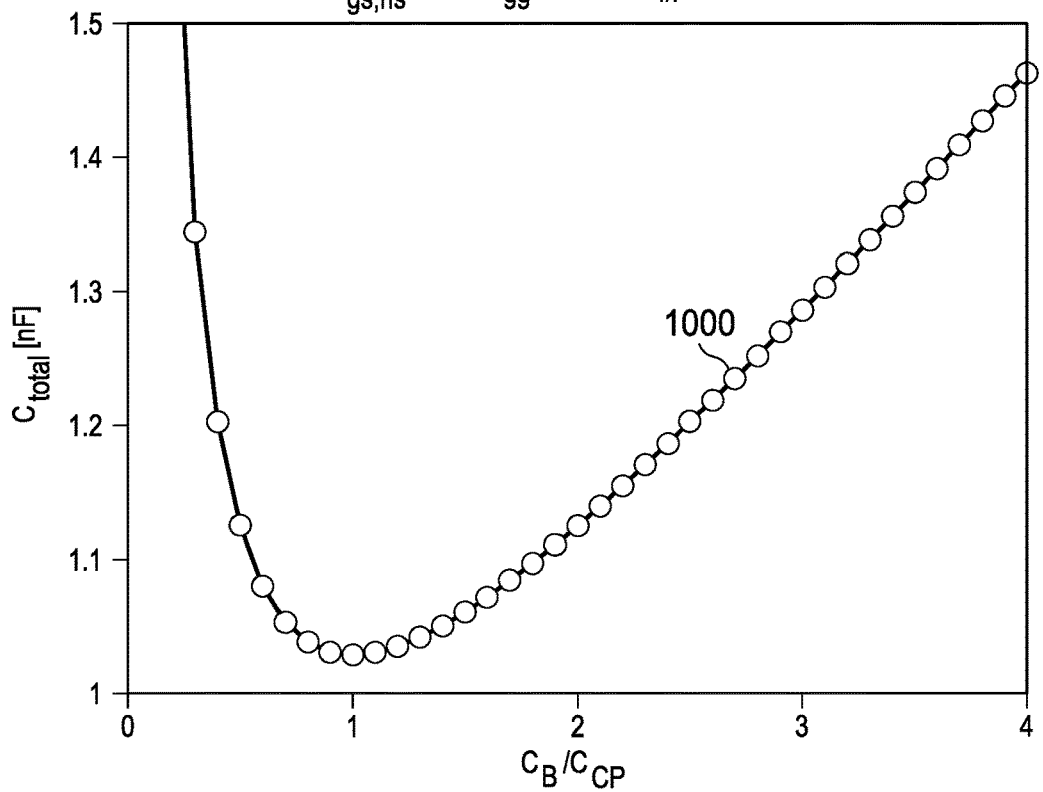
FIG. 10 is a graph showing total charge pump capacitance versus the ratio of $C_B$ to $C_{CP}$ (capacitance for a single charge pump capacitor) for various example embodiments.

FIG. 10 is a graph of total capacitance in nano-Farads versus the ratio $C_B$ to $C_{CP}$ (this ratio referred to as "N"), and illustrates possible values for capacitors $C_B$ and $C_{CP}$ for alternative example embodiments. Where $C_B$ is multiples of $C_{CP}$, the charge transfer from capacitor 407 to $C_B$ is affected. In light of this, the value for $C_B$ becomes dependent on the ratio of $C_B$ to $C_{CP}$. The value of $C_B$ is determined by the following in some example embodiments:

$$C_B = \frac{V_{gs,hs} * C_{gg} * (1 + 3*N)}{4 * V_{IN} - V_{gs,hs}} \quad (6)$$

where each of the capacitors 403, 405 and 407 have a capacitance of $C_{CP}$ so the total capacitance is given by $C_{TOTAL} = C_B + 3*C_{CP}$ and the switching converter is operating at the conditions provided in FIG. 10.

While the charge pump of the above example embodiments is connected to the gate driver for the high-side transistor, the charge pump of the example embodiments can be connected to the gate driver for the low-side transistor. However, since the source of the low-side transistor is connected to ground instead of the switching node, it is more advantageous to boost the voltage applied to high-side transistor because the source of the high-side transistor is connected to the switching node (which has changing potential based on the state of the switching converter).

FIG. 5A depicts the switching of the charge pump concurrent with the switching of the switching converter. More specifically, the low-side transistor $M_{LS}$ is turned on (and the high-side transistor $M_{HS}$ is turned off) during each $\Phi_2$ phase and vice versa during the $\Phi_1$ phase. FIG. 5B depicts an alternative example embodiment where the frequency of the charge pump clock is four times the frequency of the switching converter clock. The phases $\Phi_{11}$ and $\Phi_{22}$) of graph 550 are defined by the switching frequency of the switching converter and should not be altered by the charge pump. During period 552, the low-side transistor is on and the high-side transistor is off. During period 554, the low-side transistor is off and the high-side transistor is on. As was discussed above, the phase switching frequency of the charge pump can be independent of the switching frequency of the switching converter. However, as discussed above, phases 510 and 512 (at a minimum) should occur while the low-side switch is on (where all of the $\Phi_1$ operations do not occur at each $\Phi_1$ phase and all $\Phi_2$ operations do not occur at each $\Phi_2$ phase) and the increased voltage provided by the charge pump should occur when the high-side transistor is turning on. If the charge pump switching frequency is increased (as shown in FIG. 5B graph 560), the bootstrap capacitor $C_B$ (and, hence, the potential at $V_B$) can be recharged more than once (shown in FIG. 5B as a "first recharge" and a "second recharge"), and, hence, the potential at $V_B$ can be significantly increased. The potential at $V_B$ is shown by graph 570 and the gate-to-source voltage of the high-side transistor is shown by graph 580. Times $t_a$, $t_b$ and $t_c$ illustrates the times where high-side and low-side transistors are turned on or off.

Figure 11:
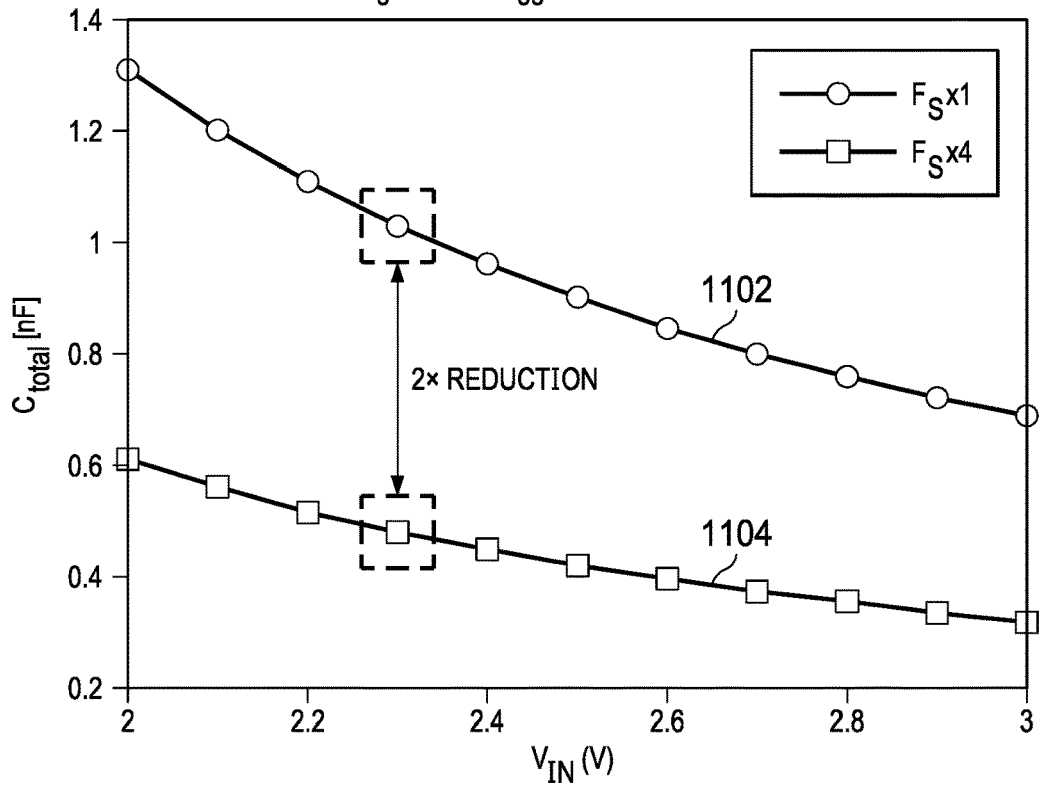
FIG. 11 is a graph showing total charge pump capacitance versus VIN for two operating charge pump frequencies for various example embodiments.

Increasing the switching frequency of the charge pump may also facilitate reducing the capacitance values for the charge pump capacitors and the bootstrap capacitor $C_B$ while still meeting the gate-to-source requirements for the high-side transistor. For example, as is shown in FIG. 11 (illustrating total capacitance versus input voltage), increasing the operating frequency of the charge pump by a factor of four allows for the reduction of the total capacitance (used for the bootstrap capacitor $C_B$ and the charge pump capacitors) by a factor of around two. Specifically, graph 1102 illustrates total capacitance versus input voltage where the switching frequency of the charge pump is $F_S$. Graph 1104 illustrates total capacitance versus input voltage under the same conditions except that the switching frequency is $4*F_S$. Based on FIG. 11, the total capacitance can be reduced by a factor of two if the switching frequency is increased by a factor of four.

Figure 6:
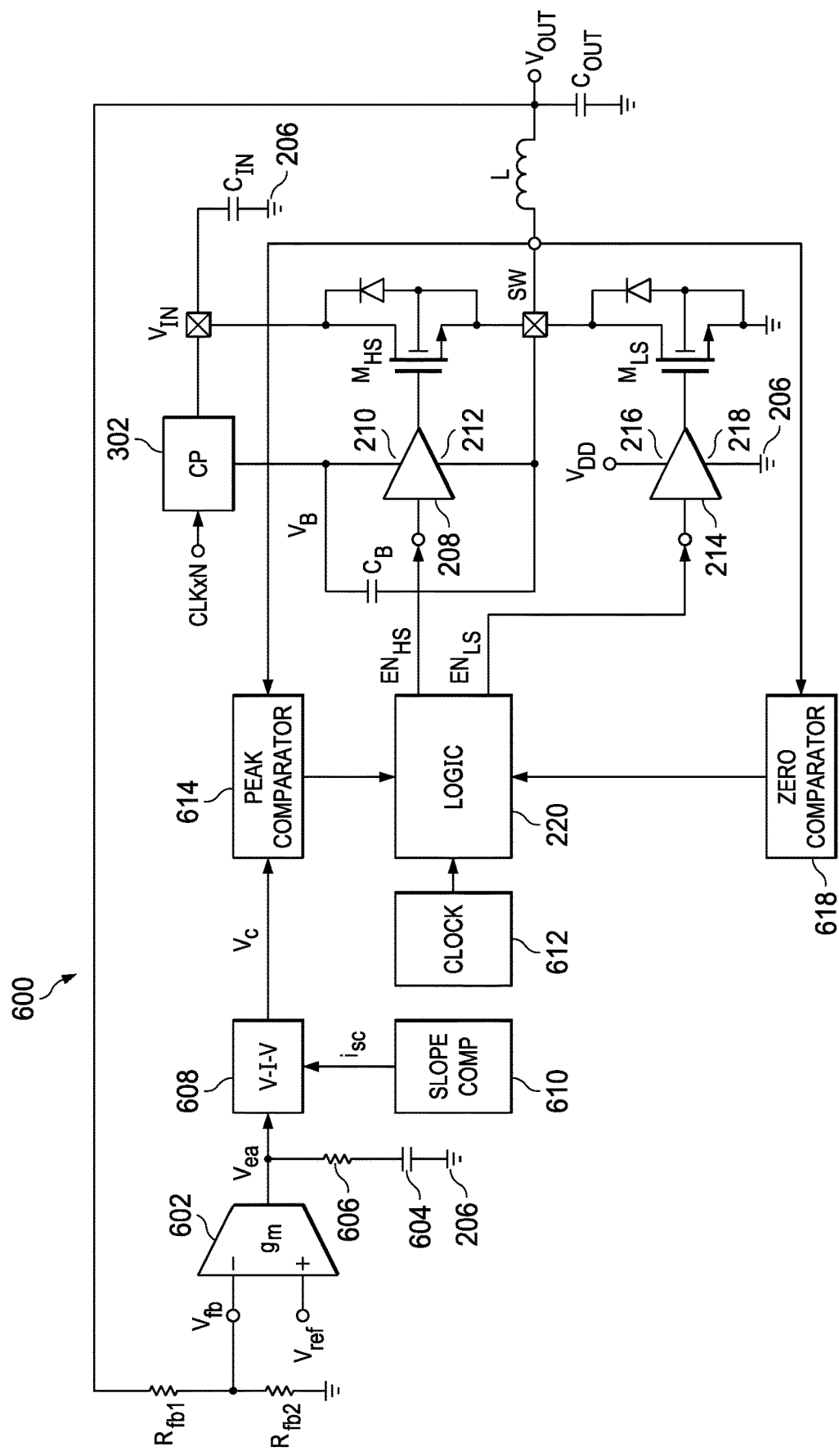
FIG. 6 is a block diagram of a switching converter in accordance with various example embodiments.

FIG. 6 illustrates an example embodiment of a buck converter that incorporates peak current control and the charge pump of another example embodiment. The configuration of high-side transistor $M_{HS}$, low-side transistor $M_{LS}$, inductor L, switching node SW, gate drivers 208 and 214, charge pump 302, controller 220, input voltage $V_{IN}$ and output voltage $V_{OUT}$ are the same as is described with reference to FIG. 3. In this example embodiment, an input capacitor $C_{IN}$ and an output capacitor $C_{OUT}$ are connected between $V_{IN}$/ground and $V_{OUT}$/ground, respectively, to reduce ripple. In addition, in this example embodiment (compared to the example embodiment of FIG. 3), the charge pump is shown to operate at a higher frequency (CLK*N) than the switching frequency (CLK provided by clock 612 to controller 220) of switching converter 600. Peak comparator 614 uses the sensed inductor current to determine whether the inductor current is larger than a target value defined by compensation voltage $V_C$. Based on the output of peak comparator 614 the controller 220 will adjust the operating mode, duty cycle or switching frequency of converter 600 to protect the components in converter 600. Similarly, zero comparator 618 uses the sensed inductor current to determine the direction of the current flow. If the inductor current is flowing from the output into the converter, zero comparator 618 will signal this to the controller 220 to adjust the operating mode, duty cycle or switching frequency. Error amplifier 602 uses feedback (through a voltage divider) from $V_{OUT}$ and a reference voltage $V_{ref}$ to output an error voltage $V_{ea}$. The error voltage and a slope compensation current, $I_{sc}$, are used by V-I-V block 608 to provide a compensation voltage $V_c$ to peak comparator 614. Peak comparator 614 along with controller 220 will use this information to determine the operating mode, converter switching frequency and duty cycle for the switching converter 600.

Figure 7:
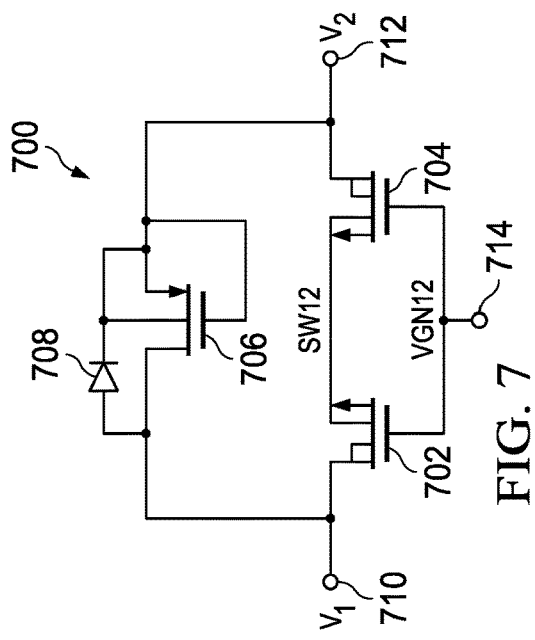
FIG. 7 is a schematic diagram of a low on-resistance switch in accordance with various example embodiments.

FIG. 7 is a circuit diagram illustrating a low-resistance switch 700 of one example embodiment. Switch 700 can be used for switches 406 and 408 in some example embodiments. The control node 714 of switch 700 is connected to the gates of nMOSFETs 702 and 704 (e.g. drain-extended MOSFETs, laterally-diffused MOSFETs or other type of transistor), and the sources of transistors 702 and 704 are connected. The drain of transistor 702 is connected to one terminal 710 of switch 700 and the drain of transistor 704 is connected to the other terminal 712 of switch 700. Transistor 706 is connected in parallel with transistors 702 and 704. Transistor 706 is shown as a pMOSFET (e.g. drain-extended MOSFETs, laterally-diffused MOSFETs or other type of transistor) with an internal body diode 708. The gate of transistor 706 is connected to the source of transistor 706 (so that transistor 706 becomes a diode-connected transistor). In operation, switch 700 should have a very low on-resistance.

Figure 8:
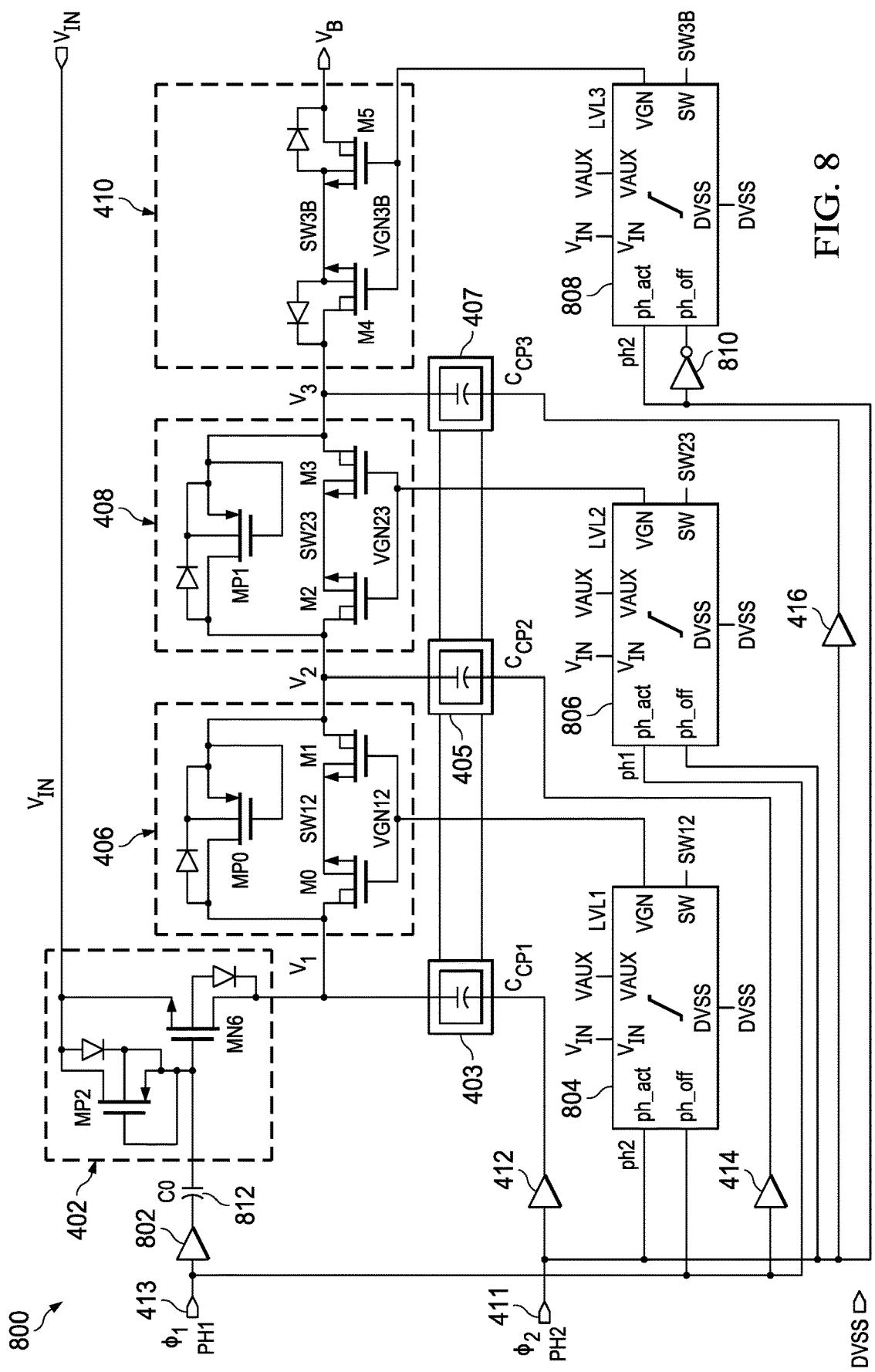
FIG. 8 is a schematic diagram of a charge pump in accordance with various example embodiments.

FIG. 8 is a circuit diagram of an example embodiment for charge pump 302. Low-resistance switch 700 is used for switches 406 and 408 and variants of low-resistance switch 700 are used for switches 402 and 410. While capacitors 403, 405 and 407 are shown to have different capacitance values ($C_{CP1}$, $C_{CP2}$, and $C_{CP3}$, respectively), these capacitors may have the same capacitance values (as is discussed with reference to FIGS. 4A-4E). Switches 402, 406 and 408, capacitors 403, 405 and 407, buffers 412, 414, 416 and 418 (in some example embodiments these buffers can be implemented using two CMOS inverters in series), $V_{IN}$, $V_B$, $V_1$, $V_2$, $V_3$ and signals $\Phi_1$ and $\Phi_2$ are the same as depicted in FIGS. 4A-4E. Additional buffer 802 and capacitor 812 are included in FIG. 8 and control the switch 402. During $\Phi_2$ the bottom plate of capacitor 812 is connected to common potential (ground in some example embodiments) and the capacitor is charged from $V_{IN}$ via the body diode of transistor MP2. During $\Phi_1$ the bottom plate of capacitor 812 is lifted to $V_{IN}$ and charge sharing between capacitor 812 and transistor MN6 (located in switch 402) occurs to lift the gate potential of MN6 over $V_{IN}$ and turn on the switch 402. Level shifters 804, 806 and 808 are included in charge pump 800 to adjust the voltages of signals $\Phi_1$ and $\Phi_2$ so that they can effectively turn on switches 406, 408 and 410 and keep theses switches in their low-resistance states. Level shifters 804, 806 and 808 are connected to $V_{IN}$, $V_{AUX}$, and signals $\Phi_1$ and $\Phi_2$. Level shifter 808 is also connected to inverter 810 to receive an inverted $\Phi_2$ signal, but it is not connected to $\Phi_1$. The operation of charge pump 800 is the same as described with reference to FIGS. 4A-4E.

Figure 9:
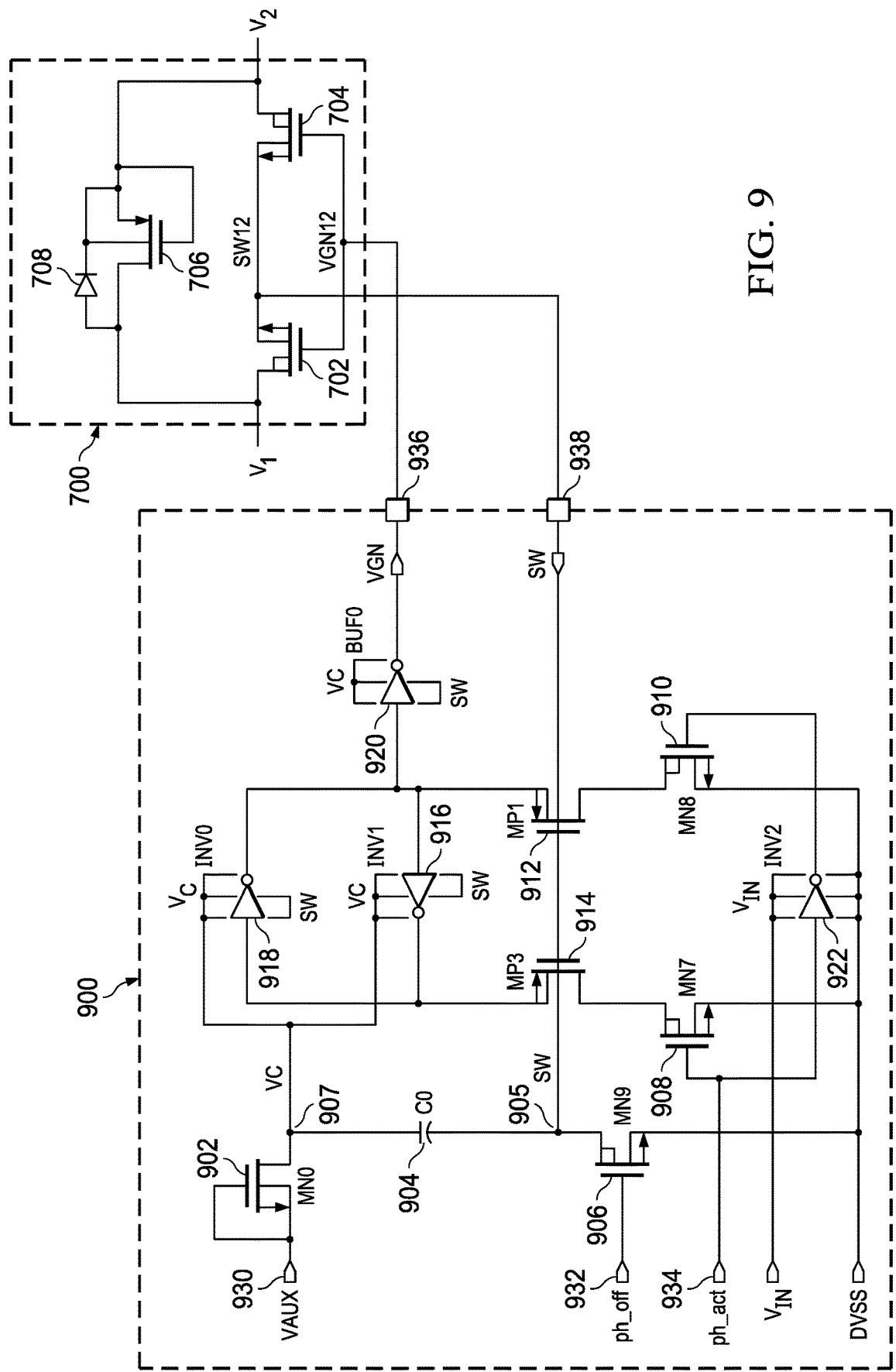
FIG. 9 is a schematic diagram of a level shifter in accordance with various example embodiments.

FIG. 9 illustrates an implementation of level shifter 900. Level shifter 900 can be used for level shifters 804, 806 and/or 808. Level shifter 900 includes inputs for $V_{AUX}$ 930 (connected to the source and gate of transistor 902), ph_off 932 (connected to the gate of transistor 906) and ph_act 934 (connected to the gate of transistor 908 and the input to inverter 922). In operation, ph_off 932 is connected to the $\Phi_1$ signal and ph_act 934 is connected to the $\Phi_2$ signal for level shifters 804 and 808. Conversely, for level shifter 806, ph_off 932 is connected to the $\Phi_2$ signal and ph_act 934 is connected to the $\Phi_1$ signal. The outputs of level shifter 900 include VGN 936 and SW 938. In this example embodiment, VGN 936 is connected to node 714 of switch 700 and SW 938 is connected between the sources of transistors 702 and 704.

The gate of transistor 902 (shown as an nMOSFET in this example embodiment) is connected to the source of transistor 902 (to form a diode-connected transistor) and to the $V_{AUX}$ 930 input. The drain of transistor 902 is connected to one plate of capacitor 904, to node 907 (which has a potential of VC) and to the positive supplies of inverters 916, 918 and buffer 920 so that one supply rail of each of these elements is at a potential VC. The input of inverter 918, the output of inverter 916 and the source of transistor 914 are connected together. The other plate of capacitor 904 is connected to the drain of transistor 906, the gates of transistors 912 and 914 (both shown as pMOSFETs in this example embodiment) and the SW 938 output of level shifter 900. Lower supply level of the buffer 920 and the inverters 918 and 916 is connected to SW 938. The source of transistor 906 (shown as an nMOSFET in this example embodiment) is connected to the supply rail DVSS (in some example embodiments this is equivalent to common potential 206). The source of transistor 912 is connected to the input of inverter 916, the output of inverter 918 and the input of buffer 920. The output of buffer 920 is the VGN 936 output of level shifter 900. The drains of transistors 912 and 914 are connected to the drains of transistors 910 and 908, respectively. The sources of transistors 908 and 910 (both shown as nMOSFETs in this example embodiment) are connected to supply rail DVSS. The gate of transistor 908 is connected to the ph_act 934 input and the gate of the gate of transistor 910 is connected to an inverted ph_act 934 input (via inverter 922). Inverter 922 is supplied by $V_{IN}$ as high supply level and DVSS as low supply level (in some example embodiments this is equivalent to common potential 206).

In operation, level shifter 900 controls the low-resistance switch 700 based on the input signals ph_off 932 and ph_act 934. In some example embodiments signals 932 and 934 are logic level signals having $V_{IN}$ as a high supply level (e.g. a binary "1") and DVSS as lower supply level (e.g. a binary "0"). When ph_off 932 is pulled high (e.g. to $V_{IN}$) transistor 906 is enabled pulling down capacitor 904. That way the level-shifter internal supply VC is recharged from $V_{AUX}$. $V_{AUX}$ can be an internal supply equal to or higher than $V_{IN}$ in some example embodiments. The DVSS referred logic level signal of ph_act 934 is shifted to a logic level signal VGN 936 referred to SW 938 as lower supply and VC forming the higher supply. The inverters 918 and 916 form a latch structure. The state of the latch structure is controlled based on ph_act 934 through transistors 908 and 910. Transistors 914 and 912 protect inverter 916, inverter 918 and related components if SW 938 is pulled to voltages above $V_{IN}$. Having a logic level signal VGN 936 referred to SW 938 as the lower supply rail facilitates controlling switch 700. A logic high level at ph_act 934 translates through level shifter 900 to an enabled switch 700 while a low level at 934 turns the switch 700 off. If ph_act 934 is at a logic low state, the node VGN 936 is pulled to SW 938 potential via buffer 920. Hence, the gate-to-source voltages for transistors 702 and 704 is around zero volts (resulting in both transistors turning off).

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "approximately" preceding a value means+/−10 percent of the stated value. As used herein, the term "modulate" shall also mean "to vary" or "to change." Unless specified to the contrary above, the terms "node", "terminal", "pin" and "connector" are used interchangeably and are not meant to require a particular electrical or physical structure. These terms are intended to be used broadly as merely an interconnection between two components or as the terminus of a component (e.g. a resistor may have two "terminals" or "ends" and a transistor may have three "terminals" or a gate, source and drain).

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A switching converter having a voltage input, a voltage output and a transistor connected between the voltage input and the voltage output, the switching converter including a control circuit comprising:
   a gate driver having an input, a first voltage supply input, a second voltage supply input and an output operable to be connected to a control terminal of the transistor;
   a bootstrap capacitor connected between the first voltage supply input and the second voltage supply input; and
   a charge pump having an input operable to be connected to the voltage input and an output connected to the first voltage supply input, the charge pump includes a first capacitor, a second capacitor and a third capacitor connected in series between the input of the charge pump and the output of the charge pump.

2. The switching converter of claim 1, wherein the transistor includes a first current terminal connected to the voltage input and a second current terminal coupled to the voltage output, the second current terminal is connected to a switching node of the switching converter.

3. The switching converter of claim 2, wherein the second voltage supply input is connected to the switching node.

4. The switching converter of claim 3, wherein the bootstrap capacitor includes a first terminal connected to the first voltage supply input and a second terminal connected to the switching node.

5. The switching converter of claim 1, wherein the charge pump includes a clock input, the clock input having a first clock phase and a second clock phase.

6. The switching converter of claim 1, wherein the charge pump includes a first switch connected between the charge pump input and the first capacitor, a second switch connected between the first capacitor and the second capacitor, a third switch connected between the second capacitor and the third capacitor and a fourth switched connected between the third capacitor and the output of the change pump.

7. The switching converter of claim 6, wherein the charge pump includes a clock input, the clock input having a first clock phase and a second clock phase.

8. The switching converter of claim 7, wherein, during the first clock phase, the first switch and the third switch are closed and the second switch and the fourth switch are open.

9. The switching converter of claim 7, wherein, during the second clock phase, the first switch and the third switch are open and the second switch and the fourth switch are closed.

10. The switching converter of claim 7, further including a controller having an output connected to the input of the gate driver.

11. A control circuit operable to turn on and off a switching converter transistor connected between an input voltage and a switching node of a switching converter, the control circuit comprising:
    a gate driver having an input, a first voltage supply input, a second voltage supply input and an output operable to be connected to a control terminal of the switching converter transistor;
    a bootstrap capacitor connected between the first voltage supply input and the second voltage supply input; and
    a charge pump having an input operable to be connected to the input voltage and an output connected to the first voltage supply input, the charge pump includes a first capacitor, a second capacitor and a third capacitor connected in series between the input of the charge pump and the output of the charge pump.

12. The control circuit of claim 11, wherein the second voltage supply input is connected to the switching node.

13. The control circuit of claim 11, wherein the bootstrap capacitor includes a first terminal connected to the first voltage supply input and a second terminal connected to the switching node.

14. The control circuit of claim 11, wherein the charge pump includes a first switch connected between the charge pump input and the first capacitor, a second switch connected between the first capacitor and the second capacitor, a third switch connected between the second capacitor and the third capacitor and a fourth switched connected between the third capacitor and the output of the change pump.

15. The control circuit of claim 14, wherein the charge pump includes a clock input, the clock input having a first clock phase and a second clock phase.

16. The control circuit of claim 15, wherein, during the first clock phase, the first switch and the third switch are closed and the second switch and the fourth switch are open.

17. The control circuit of claim 15, wherein, during the second clock phase, the first switch and the third switch are open and the second switch and the fourth switch are closed.

18. A switching converter comprising:
- an input connected to an input voltage;
- an output connected to an output voltage;
- a switching node coupled to the output of the switching converter;
- a high-side transistor having a control terminal, a first current terminal connected to the input of the switching converter and a second current terminal connected to the switching node;
- a gate driver having a first voltage supply input, a second voltage supply input connected to the switching node and an output connected to the control terminal of the high-side transistor;
- a bootstrap capacitor connected between the first voltage supply input and the second voltage supply input;
- a charge pump having an input connected to the input voltage and an output connected to the first voltage supply input, the charge pump includes a first capacitor, a second capacitor and a third capacitor connected in series between the input of the charge pump and the output of the charge pump; and
- wherein the charge pump stores a charge during a period when the high-side transistor is off and supplies a voltage greater than the input voltage at the output of the charge pump when the high-side transistor is turned on.

* * * * *